(12) United States Patent
Tsujimoto

(10) Patent No.: US 10,126,330 B2
(45) Date of Patent: Nov. 13, 2018

(54) CLAMP-TYPE AMMETER

(71) Applicant: OSAKA CITY UNIVERSITY, Osaka (JP)

(72) Inventor: Hiroaki Tsujimoto, Osaka (JP)

(73) Assignee: OSAKA CITY UNIVERSITY, Osaka-Shi (JP)

( * ) Notice: Subject to any disclaimer, the term of this patent is extended or adjusted under 35 U.S.C. 154(b) by 0 days.

(21) Appl. No.: 15/125,590

(22) PCT Filed: Mar. 20, 2015

(86) PCT No.: PCT/JP2015/001574
§ 371 (c)(1),
(2) Date: Sep. 13, 2016

(87) PCT Pub. No.: WO2015/141234
PCT Pub. Date: Sep. 24, 2015

(65) Prior Publication Data
US 2017/0003320 A1 Jan. 5, 2017

(30) Foreign Application Priority Data
Mar. 20, 2014 (JP) .................................. 2014-059172

(51) Int. Cl.
*G01R 1/04* (2006.01)
*G01R 1/20* (2006.01)
(Continued)

(52) U.S. Cl.
CPC ............. *G01R 1/22* (2013.01); *G01R 15/186* (2013.01); *G01R 15/202* (2013.01); *G01R 15/207* (2013.01)

(58) Field of Classification Search
CPC ...... G01R 15/06; G01R 15/148; G01R 15/16; G01R 1/04; G01R 1/20; G01R 1/22;
(Continued)

(56) References Cited

U.S. PATENT DOCUMENTS 3,626,291 A 12/1971 Yauch
4,316,142 A * 2/1982 Kuramoto ................ G01R 1/22
324/127
(Continued)

FOREIGN PATENT DOCUMENTS

DE 19962323 7/2001
JP S54-115174 9/1979
(Continued)

OTHER PUBLICATIONS

International Search Report, PCT, dated Jun. 16, 2015, Application No. PCT/JP2015/001574.
(Continued)

*Primary Examiner* — Neel Shah
(74) *Attorney, Agent, or Firm* — Lex IP Meister, PLLC

(57) ABSTRACT

This clamp-type ammeter has a flexible substrate of which an inner wall is configured to be able to deform into a substantially cylindrical shape. The clamp-type ammeter has a plurality of magnetic sensor elements disposed at the inner wall of the flexible substrate. The clamp-type ammeter has a tube of which one end is connected to the flexible substrate. The clamp-type ammeter has an operation unit that is connected to the other end of the tube and that can operate the deformation of the flexible substrate.

6 Claims, 4 Drawing Sheets

(51) Int. Cl.
*G01R 1/22* (2006.01)
*G01R 15/06* (2006.01)
*G01R 15/16* (2006.01)
*G01R 31/00* (2006.01)
*G01R 33/00* (2006.01)
*G01R 33/02* (2006.01)
*G01R 19/00* (2006.01)
*G01R 35/00* (2006.01)
*G08B 1/08* (2006.01)
*G08B 21/00* (2006.01)
*G01R 15/20* (2006.01)
*G01R 15/18* (2006.01)

(58) Field of Classification Search
CPC ........ G01R 1/30; G01R 31/00; G01R 31/024; G01R 33/02; G01R 33/09; G01R 19/00; G01R 19/14; G01R 35/00; G08B 1/08; G08B 21/00
USPC ........ 324/115, 117 R, 117 H, 126, 127, 130, 324/149, 202, 244, 252, 688
See application file for complete search history.

(56) References Cited

U.S. PATENT DOCUMENTS

| | | | | |
|---|---|---|---|---|
| 5,057,769 | A | * | 10/1991 | Edwards .............. G01R 15/181 324/127 |
| 5,473,244 | A | | 12/1995 | Libove |
| 5,585,719 | A | | 12/1996 | Endo et al. |
| 6,456,060 | B1 | * | 9/2002 | Wiesemann .............. G01R 1/22 324/127 |
| 2009/0251308 | A1 | * | 10/2009 | Schweitzer .......... G01R 31/025 340/539.1 |
| 2009/0284254 | A1 | * | 11/2009 | Kasajima ............... G01R 33/09 324/207.21 |
| 2011/0068773 | A1 | | 3/2011 | Harkness et al. |
| 2012/0256617 | A1 | | 10/2012 | Moreux et al. |
| 2013/0076343 | A1 | * | 3/2013 | Carpenter .............. G01R 33/02 324/202 |
| 2013/0099775 | A1 | * | 4/2013 | Mitsuya ............... G01R 15/207 324/126 |
| 2015/0153401 | A1 | * | 6/2015 | Tsujimoto ........... G01R 31/024 324/551 |

FOREIGN PATENT DOCUMENTS

| | | |
|---|---|---|
| JP | 59-152465 | 10/1984 |
| JP | S63113982 | 5/1988 |
| JP | 63-253264 | 10/1988 |
| JP | H07-004988 | 1/1995 |
| JP | H08213668 | 8/1996 |
| JP | 09-196607 | 7/1997 |
| JP | 2005-055326 | 3/2005 |
| JP | 2005-259803 | 9/2005 |
| JP | 2009-014366 | 1/2009 |
| WO | 2013187057 | 12/2013 |

OTHER PUBLICATIONS

EPO, Extended European Search Report of EP 15764631.6 dated Nov. 9, 2017.

JPO Office Action of Application No. 2016-508546, dated Jan. 23, 2018.

JPO, Office Action of Application No. 2016-508546, dated Apr. 3, 2018.

* cited by examiner

CLAMP-TYPE AMMETER

TECHNICAL FIELD

The present invention relates to an ammeter for clamping a conductor where current flow.

BACKGROUND ART

Conventionally clamp-type ammeter is used to measure the current flowing in the wire. A clamp-type ammeter presents a substantially annular shape and accommodates current sensors in each of one side holder portion and the other side holder portion disposed opposite to each other, and has a structure which openably mounts on the instrument body one side sensor and the other side sensor comprising a joining end contacting with each other when closing (Patent Literature 1).

The clamp-type ammeter leads the magnetic field generated by current flowing through the electric wire to a current sensor such as a Hall element, by surrounding (clamping) the electric wire through which current flows with one side sensor portion and the other side sensor portion which are openably constituted.

CITATION LIST

Patent Literature

Patent Literature 1: Japanese Unexamined Patent Publication No. 2009-014366

SUMMARY OF INVENTION

Technical Problem

Conventional clamp-type ammeter forms a magnetic path with high permeability holder, it has been configured so as to sandwich the Hall element to the cross section of the magnetic path. However, since a size of the plane of the Hall element was necessary for the cross-sectional area of the arm, there is a problem that it can not be too small.

Solution to Problem

The present invention has been conceived in view of the above problems, and provides an ammeter which can measure the current flowing through the electric wire disposed in the narrow section.

More specifically, a clamp-type ammeter of the present invention is characterized by including

- a flexible substrate of which an inner wall is configured to be able to deform into an substantially cylindrical shape,
- a plurality of magnetic sensor elements disposed at the inner wall of the flexible substrate,
- a current source to which a plurality of magnetic sensor elements are connected in parallel,
- a common output terminal of the plurality of magnetic sensor elements.

Advantageous Effects of Invention

A clamp-type ammeter according to the present invention, because the magnetic sensor elements are disposed on the inner wall of the flexible substrate deformable into a cylindrical shape, by disposing this at the distal end of the elongated tube and manipulating the deformation of the flexible substrate at hand, it is possible to grasp the wire disposed behind the narrowed position and measure the current.

Further when the inner wall becomes cylindrical shape, by arranging the magnetic sensor elements such that these are at the positions of point symmetry with the center of the cylinder bottom as a symmetrical point, even if a clamped electric wire is apart from the cylindrical axis, it is possible to measure with reduced errors.

Also because such the arrangement makes each of the magnetic sensor elements cancel disturbance noise, even if the electric wire that generates a magnetic field around it at the time of measurement, it is possible to reduce the error.

DESCRIPTION OF THE INVENTION

The clamp-type ammeter according to the present invention will be described with reference to the drawings. The following description is intended to illustrate one embodiment of the present invention, and is not intended to be limited to the following description.

Figure 1:
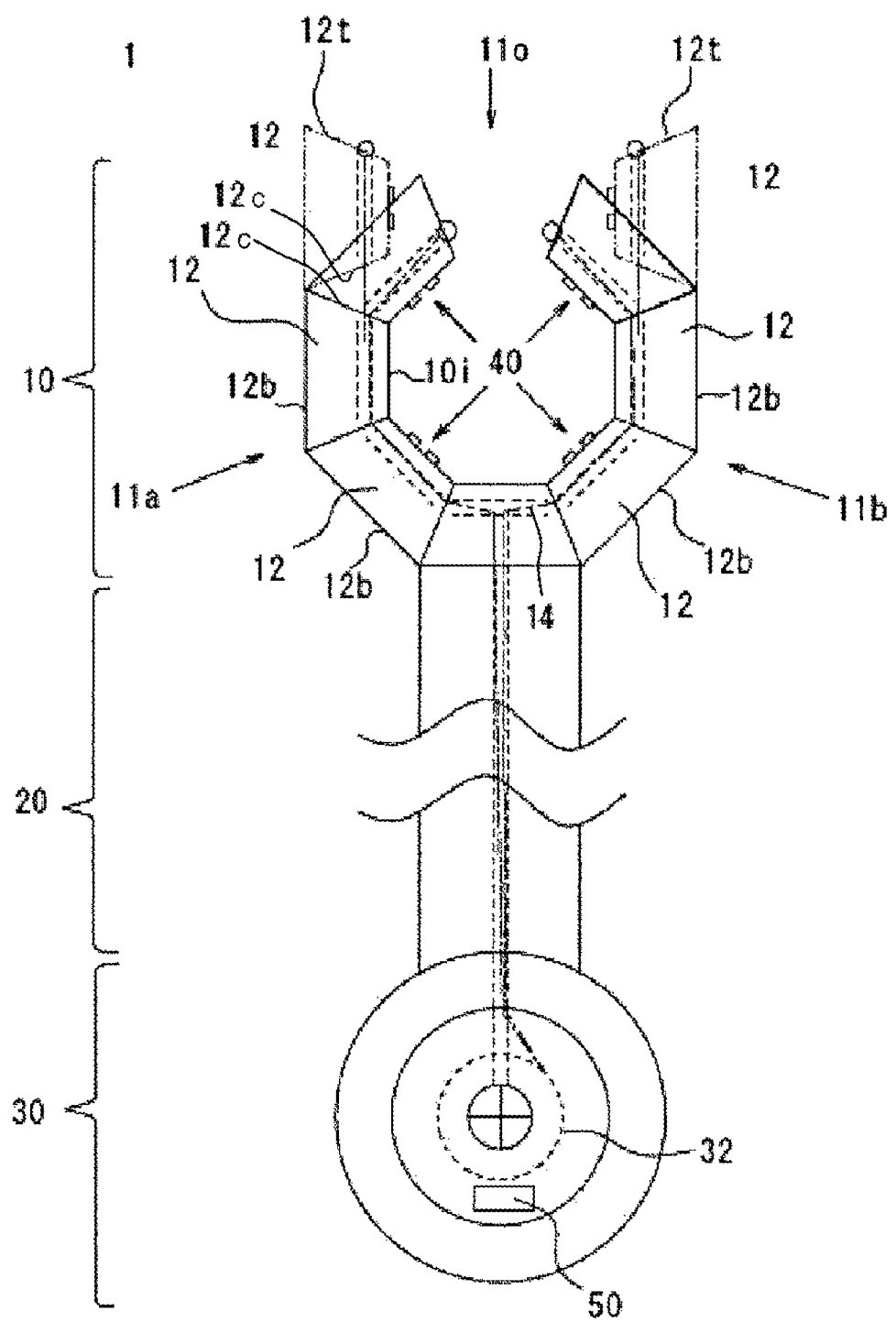
FIG. 1 is a diagram showing a configuration of a clamp-type ammeter according to the present invention.

Referring to FIG. 1, clamp-type ammeter 1 according to the present invention includes a flexible substrate 10, a long tube 20, an operation unit 30. Also on the inner wall 10i of the flexible substrate 10, a plurality of magnetic sensor elements 40 are provided, the sensor circuit 50 for driving the magnetic sensor element 40 is disposed in the operation unit 30.

Figure 2:
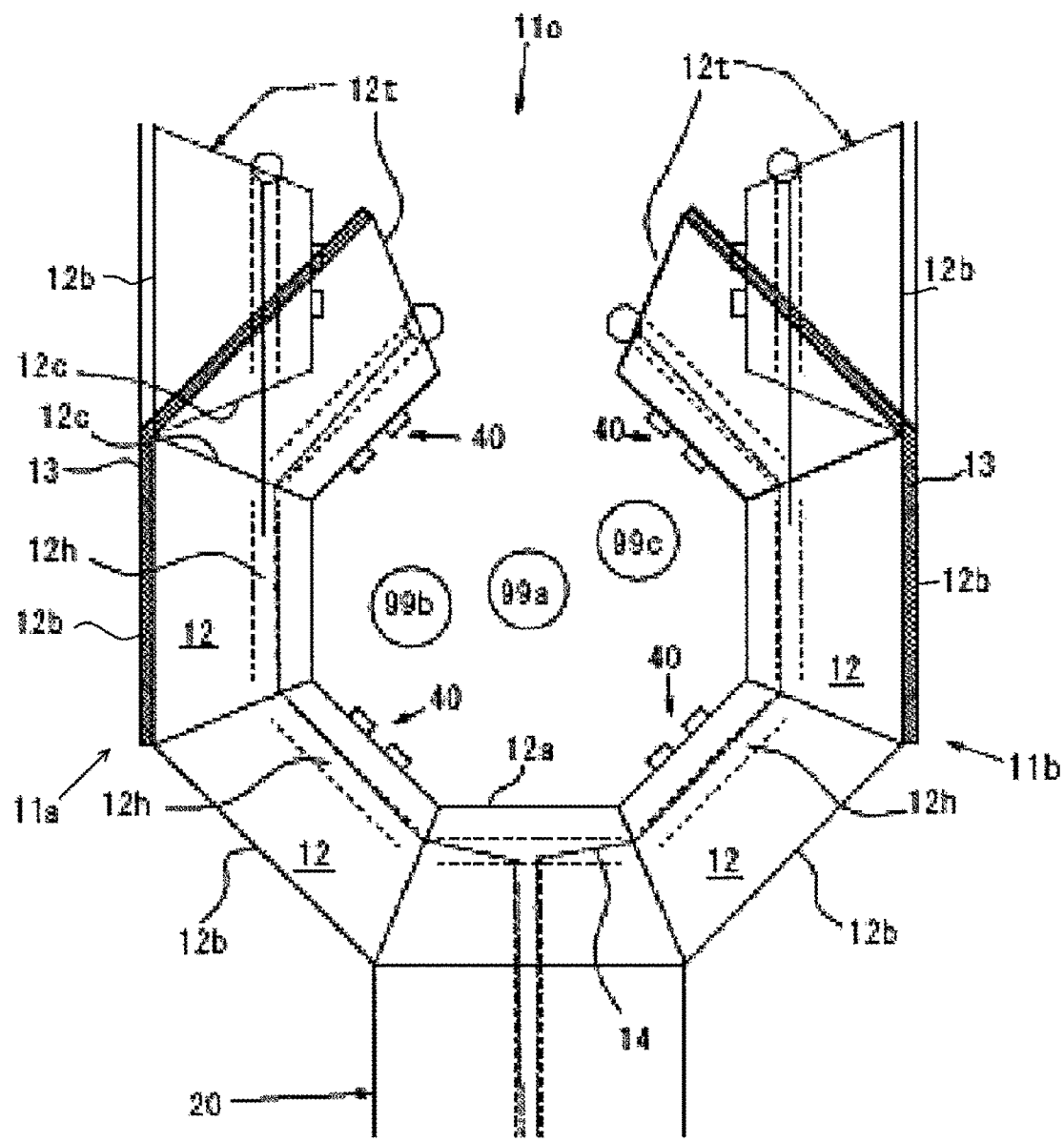
FIG. 2 is a diagram showing an enlarged portion of the flexible substrate.

FIG. 2 shows an enlarged view of the flexible substrate 10. Flexible substrate 10 is constituted with the arm portion 11a, 11b opened in the Y-shape or U-shape. Block pieces 12 whose cross section is trapezoidal are incorporated into arms 11a, 11b, respectively. In the each block pieces 12, the base of the trapezoid 12b is fixed to the plate spring 13 of non-magnetic material. Moreover, they are connected by wires 14 through holes 12h provided in the vicinity of the upper side of the trapezoid 12a.

Referring again to FIG. 1, the wire 14 is fixed to the block piece 12t at the tip of the arm portion 11a, 11b. The fixed end of the wire 14 is referred to as a "fixed end". Therefore, the end at the non-fixed side of the wire 14 (called as the "free end") is pulled, hypotenuses of the trapezoid 12c come into contact with each other, both of the arms 11a, 11b is deformed substantially in the semi-circular shape. Note here substantially semi-circular shape includes half of the polygon. As the block piece 12 is biased by a plate spring 13 in the opposite direction to the direction pulled by the wire 14, it returns to the original open state when the wire 14 is loosened. On the outside of the block piece 12, film having stretchability and flexibility (not shown) may be disposed.

The operating unit 30 is mounted on the end of the elongated tube 20 towards which the flexible substrate 10 is not attached. The operation unit 30 includes a reel 32 to take up the least wire 14. The free end of the wire 14 is connected to the reel 32 of the operation unit 30 through the elongated tube 20. When the wire 14 is taken up by the operation section 30, the inner wall 10i of the arm portion 11a, 11b is deformed into a substantially cylindrical shape. The arm portion 11a, 11b returns to the open state when the wire 14 is paid out by loosening the reel 32.

That is, the arm portions 11a, 11b are opened and closed by operating the operation unit 30. Due to this configuration, the operation section 30 is placed at the hand side, and the flexible substrate 10 is inserted to the narrow section, it is possible to clamp the complex cables.

Referring again to FIG. 2, the clamp-type ammeter 1 according to the present invention, it is possible to measure the current when a wire 99 is brought into position near the center axis of the space surrounded by the arm portions 11a, 11b. In other words, the wire 99 is not needed to be completely surrounded. Thus, in FIG. 2, even when the arm portions 11a, 11b are closed, an example in which the distal end portion is open is shown. A place which is open is indicated at sign 11o.

As described later, it is sufficient for the electric wire 99 to position near the center axis of the space surrounded by the arm portions 11a, 11b. The clamp-type ammeter 1 according to the present invention can measure current with less error if there is electric wire 99 in the space where the magnetic sensor elements 40 surround. That is, at any position among signs 99a 99b, 99c of FIG. 2, current measurement is possible.

Figure 3:
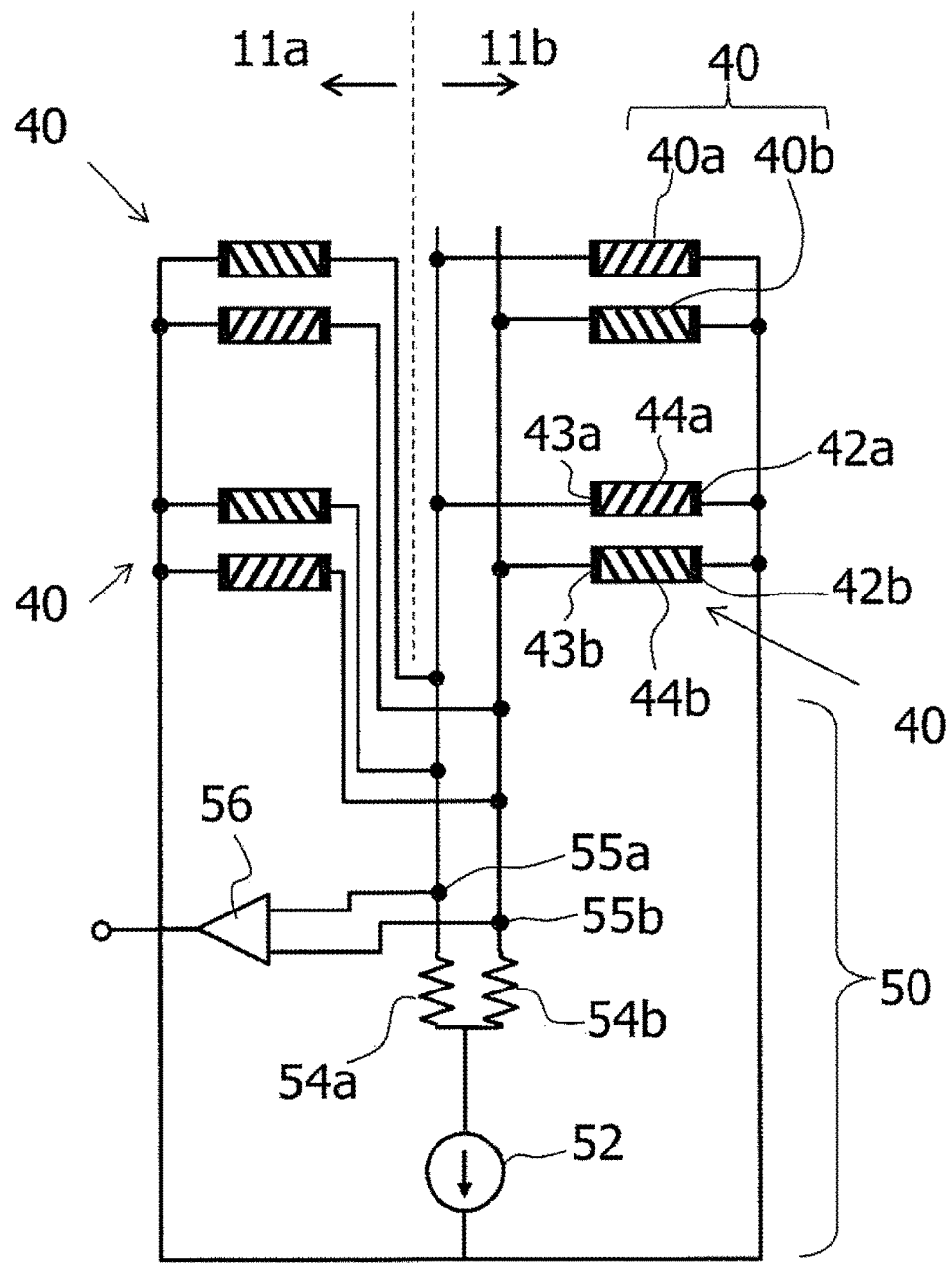
FIG. 3 is a diagram showing a circuit configuration of the clamp-type ammeter according to the present invention.
Figure 4:
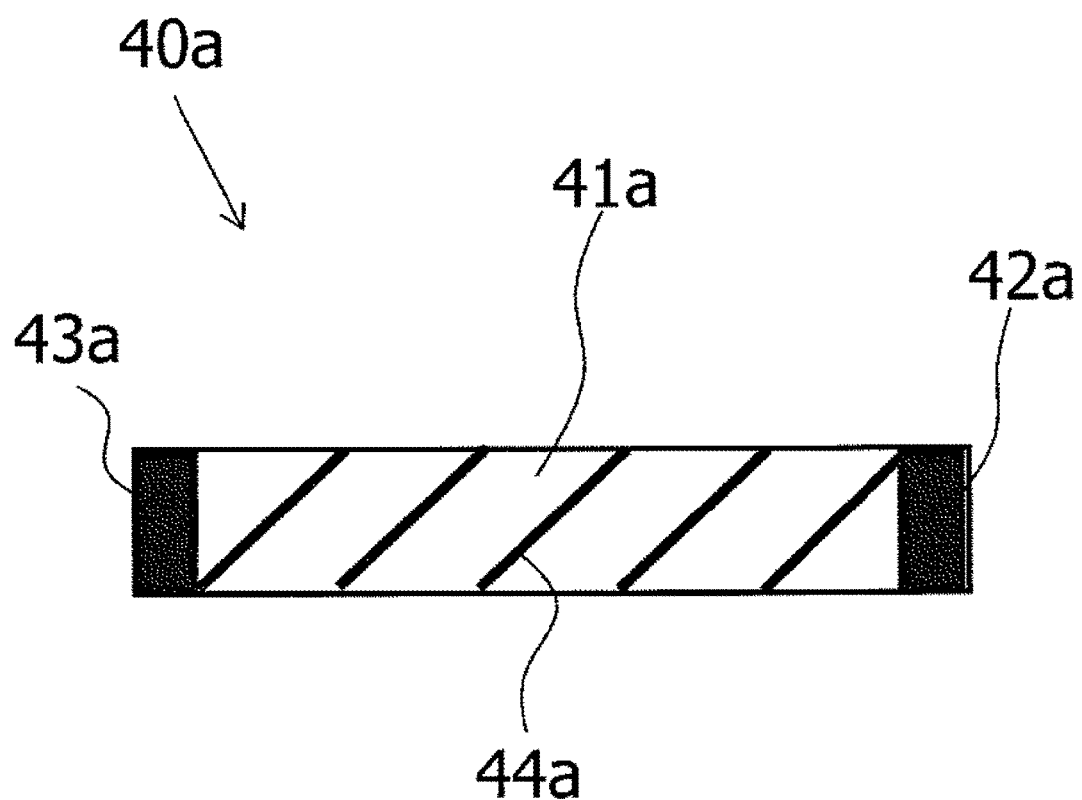
FIG. 4 is a diagram showing the configuration of a magnetic sensor element.

FIG. 3 shows the magnetic sensor element 40 and the sensor circuit 50 installed in the clamp-type ammeter 1. A plurality of the magnetic sensor elements 40 are disposed on the surface of the inner wall 10i of the flexible substrate 10. As for the magnetic sensor element 40, two of the magnetic sensor elements 40a and 40b are arranged in pairs. Referring now to FIG. 4, one magnetic sensor element 40a will be described.

The magnetic sensor element 40a is formed with a strip-shaped magnetic film 41a. It is desirable for magnetic film 41a that easy magnetization axis is induced in the strip-shaped longitudinal direction. Element terminals 42a, 43a are also formed at the both ends the in the longitudinal direction of strip-shaped magnetic films 41a.

Further conductor portion 44a formed of a conductive material is provided on the surface of the magnetic film 41a. Conductor portion 44a is provided inclined with respect to the strip longitudinal direction. This is a magnetic sensor element 40a in which a pattern of so-called barber pole type formed. In the thus formed magnetic sensor elements 40a, magnetoresistance effect is expressed so that bias magnetic field is set for the magnetic field from a direction perpendicular to the strip longitudinal direction.

Referring again to FIG. 3, magnetic sensor elements 40a and 40b having the same characteristics are used. Tilt direction of conductor portions 44a and 44b is in the opposite direction. When the magnetic field is applied from the same direction, it is configured that the resistance value of one raises and that of the other drops, in order to double the output of the magnetoresistive effect.

In FIG. 3 illustrated the case of four of the magnetic sensor element 40 by an example. Two of the magnetic sensor element 40 are disposed on the inner wall 10i side of the arm portion 11a and the other two are disposed on the inner wall 10i of arm portion 11b. Four magnetic sensor element 40 are arranged at symmetrical positions with respect to the cylindrical axis when the arm portions 11a, 11b are closed and inner wall 10i is deformed into a substantially cylindrical shape (see FIG. 2). In FIG. 3, the border of arm portions 11a, 11b is expressed with dotted lines.

One end 42a, 42b of the magnetic sensor element 40 is connected to one pole of the current source 52. And the other end 43a, 43b is connected to the other pole of the current source 52 through a resistor 54a, 54b. That is, the magnetic sensor element 40 is connected so as to be parallel to the current source 52 via a resistor 54. In addition, the magnetic sensor elements 40 are plural, but resistance 54a, 54b may be one set.

In addition, the common output terminal 55a, 55b between the resistance 54a, 54b and the magnetic sensor element 40 is provided. That is, since a plurality of magnetic sensor elements 40 are connected to a pair of resistors 54a, 54b, the output of the magnetic sensor element 40 (the voltage) are averaged and outputted at the common output terminal 55a, 55b. The common output terminal 55a, 55b may be connected to the amplifier 56. Accordingly, the output of the amplifier 56 may be common output, that is, an output of the clamp-type ammeter 1 according to the present invention. The current source 52, and the amplifier 56 are provided on the operation unit 30 side.

The operation of the clamping ammeter 1 configured as above will be explained. The operator grips the wires disposed in the narrow section with the flexible substrate 10 by operating the clamping ammeter 1 of the operation unit 30 (see FIG. 1, FIG. 2). Then, the current source 52 and the magnetic sensor element 40 are conducted by the switch provided on the operation unit 30 (not shown) (see FIG. 3). Current flowing from the current source 52 flows to magnetic films 41a, 41b of the four magnetic sensor element 40 and returns to the current source 52 through the resistor 54a, 54b. Accordingly, a bridge circuit is formed by magnetic films 41a, 41b and resistors 54a, 54b. Further, the average value of the outputs of the four magnetic sensor elements 40 is output to the common output terminal 55a, 55b.

When flexible substrate 10 is closed and the inner wall 10i is deformed into a substantially cylindrical, the magnetic field generated by current flowing through the clamped wire tilts the easy magnetization axis of magnetic film 41a, 41b to the same direction. Because the inclined direction of conductor portion 44a 44b in the magnetic sensor elements 40a, 40b are constituted in different directions, changes in the magnetic resistance of the magnetic sensor element 40a and the magnetic sensor element 40b are in the opposite direction. Since these form a bridge circuit with resistors 54a 54b, the output of the magnetic sensor element 40 is doubled compared with the case of only one magnetic sensor element 40a.

Further, the magnetic sensor element 40 is disposed on the inner wall 10i at a position symmetrical with respect to the cylindrical axis. When thus arranged and the wire is clamped with the inner wall 10i which is deformed into a substantially cylindrical shape, the output is constant regardless of the position of the wire. Further, since the magnetic sensor element 40 is disposed at a position symmetrical to the axis of the cylindrical inner wall 10i, the magnetic field from the outside is canceled. Therefore, even if the wire that generates a magnetic field around, it does not have a significant effect on the output.

Further, it has been explained that the magnetic sensor element 40 is disposed on the substantially cylindrical inner wall 10i, it may be arranged along spirally, ring-shaped member overlapped shape or vertically straight direction. Although the measurement target has been described as a wire, it may be the form of the case of the bus bar or the like.

In the above description, an ammeter has been described as an example, it may be configured as a power sensor using a magnetic film.

INDUSTRIAL APPLICABILITY

Clamp-type ammeter according to the present invention, the gripping portion can be formed to be small, it is possible to measure the current flowing through the electric wire disposed in a narrow place, and to be utilized as a maintenance equipment for motor vehicle or electrical equipment and so on. Further, it can be also used as an ammeter retrofitted to an electrical circuit that is already connected.

REFERENCE SIGNS LIST 1 clamp-type ammeter
10 flexible substrate
10i inner wall
11a, 11b arm portion
110 opening to that point
12 block pieces
12a the upper side of the trapezoid
12h through-hole
12b the base of the trapezoid
12c hypotenuse of the trapezoidal
12t block piece
13 plate spring
14 wire
20 elongated tube
30 operating unit
32 reel
40 (40a, 40b) magnetic sensor element
41a magnetic films
42a, 43a element terminal
44a, 44b conductor portion
50 sensor circuit
52 current source
54a, 54b resistance
55a, 55b common output terminal
56 amplifier
99 wire

The invention claimed is:

1. A clamp-type ammeter comprising:
a flexible substrate of which an inner wall is configured to be able to deform into a substantially cylindrical shape;
a plurality of magnetic sensor elements disposed at the inner wall of the flexible substrate;
a tube of which one end is connected to the flexible substrate;
and an operation unit that is connected to the other end of the tube and that can operate the deformation of the flexible substrate;
wherein the flexible substrate has two arm portions connected so that the flexible substrate is Y-shaped or U-shaped when the two arm portions are open,
the two arm portions can be opened and closed by the operation of the operation unit,
the two arm portions include a plurality of block pieces whose cross-section is trapezoidal, and a wire for connecting the plurality of block pieces,
a base of a first block piece which is the block piece of an end of the two arm portions and a base of a second block piece coupled to the first block piece are fixed to an elastic body,
one end of the wire is fixed to the first block piece,
when the other end of the wire is pulled, a hypotenuse of the first block piece and a hypotenuse of the second block piece are in contact and the two arm portions are deformed into a substantially semicircular shape,
and wherein the plurality of magnetic sensor elements are arranged so that they are located at the positions of point symmetry with the center of the substantially cylindrical shape as a symmetrical point when the inner wall becomes the substantially cylindrical shape.

2. The clamp-type ammeter according to claim 1, wherein the plurality of magnetic sensor elements are arranged so that they are located at the positions of point symmetry with the center of the substantially cylindrical shape as a symmetrical point when the two arm portions are closed.

3. The clamp-type ammeter according to claim 1, wherein the first block piece, the second block piece, a third block piece, and one block piece common to the two arm portions are connected in sequence in each of the two arm portions,
one of the plurality of magnetic sensor elements is arranged at the upper side of the first block piece,
one of the plurality of magnetic sensor elements is arranged at the upper side of the third block piece.

4. A clamp-type ammeter comprising:
a flexible substrate of which an inner wall is configured to be able to deform into a substantially cylindrical shape;
a plurality of magnetic sensor elements disposed at the inner wall of the flexible substrate;
a tube of which one end is connected to the flexible substrate; and
an operation unit that is connected to the other end of the tube and that can operate the deformation of the flexible substrate;
wherein each of the plurality of the magnetic sensor elements includes a magnetic film, and a conductor portion formed of a conducting material on the surface of the magnetic film and provided to be inclined to the longitudinal direction of the magnetic film,
the plurality of magnetic sensor elements includes a plurality of pairs of magnetic sensor elements,
a first magnetic sensor element and a second magnetic sensor element constituting the pair are disposed in substantially parallel and inclination directions of the conductor portions, which each of the first magnetic sensor element and the second magnetic sensor element includes, are different, and
wherein the clamp-type ammeter further comprises:
a current source of which one pole is connected to one end of each of the first magnetic sensor element and one end of each of the second magnetic sensor element,
a first resistor whose one end is connected to the other end of each of the first magnetic sensor element of each of the plurality of the pairs of the magnetic sensor elements, and whose the other end is connected to the other pole of the current source, and
a second resistor whose one end is connected to the other end of each of the second magnetic sensor element of each of the plurality of the pairs of the magnetic sensor elements, and whose the other end is connected to the other pole of the current source.

5. The clamp-type ammeter according to claim 4, wherein easy magnetization axis is induced in a strip-shaped longitudinal direction in the magnetic film.

6. The clamp-type ammeter according to claim 4, comprising:

a first common output terminal connected between the other end of each of the first magnetic sensor element of each of the plurality of the pairs of the magnetic sensor elements and the first resistor; and a second common output terminal connected between the other end of each of the second magnetic sensor element of each of the plurality of the pairs of the magnetic sensor elements and the second resistor, wherein current is detected by measuring voltage difference between the first common output terminal and the second common output terminal.

* * * * *